United States Patent
Oda et al.

(10) Patent No.: US 10,526,498 B2
(45) Date of Patent: Jan. 7, 2020

(54) INK FOR ORGANIC EL

(71) Applicant: JOLED Inc., Tokyo (JP)

(72) Inventors: Tomohiko Oda, Tokyo (JP); Shinichiro Ishino, Tokyo (JP); Koyo Sakamoto, Tokyo (JP); Yasuhiro Yamauchi, Tokyo (JP)

(73) Assignee: JOLED INC., Tokyo (JP)

( * ) Notice: Subject to any disclaimer, the term of this patent is extended or adjusted under 35 U.S.C. 154(b) by 92 days.

(21) Appl. No.: 15/665,237

(22) Filed: Jul. 31, 2017

(65) Prior Publication Data
US 2018/0030297 A1    Feb. 1, 2018

(30) Foreign Application Priority Data
Aug. 1, 2016   (JP) .................. 2016-151332

(51) Int. Cl.
| | | |
|---|---|---|
| H01B 1/12 | (2006.01) | |
| C09D 11/36 | (2014.01) | |
| C09D 11/52 | (2014.01) | |
| H01L 51/00 | (2006.01) | |
| H01L 51/50 | (2006.01) | |

(52) U.S. Cl.
CPC .............. C09D 11/36 (2013.01); C09D 11/52 (2013.01); H01B 1/12 (2013.01); H01L 51/0039 (2013.01); H01L 51/0005 (2013.01); H01L 51/5012 (2013.01); H01L 51/5056 (2013.01); H01L 51/5072 (2013.01); H01L 51/5088 (2013.01); H01L 51/5092 (2013.01); H01L 51/5096 (2013.01)

(58) Field of Classification Search
CPC ..... C09D 11/36; C09D 11/52; H01L 51/0005; H01L 51/0039; H01L 51/5012; H01L 51/5056; H01L 51/5072; H01L 51/5088; H01L 51/5092; H01L 51/5096; H01B 1/12
See application file for complete search history.

(56) References Cited

U.S. PATENT DOCUMENTS

2012/0001124 A1 * 1/2012 Ishino ............... C09D 5/22
                                                          252/301.16
2014/0008642 A1 * 1/2014 Morita ............ H01L 51/0004
                                                          257/40

FOREIGN PATENT DOCUMENTS

| JP | 2008-234984 A | 10/2008 | | |
|---|---|---|---|---|
| JP | 2009-266753 A | 11/2009 | | |
| WO | WO-2012074909 A1 * | 6/2012 | ......... | H01L 51/0007 |
| WO | 2012/132863 A1 | 10/2012 | | |

* cited by examiner

*Primary Examiner* — Mark Kopec
*Assistant Examiner* — Jaison P Thomas
(74) *Attorney, Agent, or Firm* — Xsensus LLP

(57) ABSTRACT

According to one embodiment, an ink for organic EL includes an organic EL contributing material and an organic solvent. A relative energy difference RED based on Hansen solubility parameters which attribute to the organic EL contributing material and the organic solvent, respectively, is less than 0.5.

7 Claims, No Drawings

US 10,526,498 B2

INK FOR ORGANIC EL

CROSS-REFERENCE TO RELATED APPLICATIONS

This application is based upon and claims the benefit of priority from Japanese Patent Application No. 2016-151332, filed Aug. 1, 2016, the entire contents of which are incorporated herein by reference.

FIELD

Embodiments described herein relate generally to an ink for organic EL.

BACKGROUND

Organic electroluminescence (EL) elements have a structure in which an organic layer containing a light-emitting layer is sandwiched between two sheets of electrodes. Organic EL elements emit light when current flows the organic layer. The organic layer may comprise a carrier injection layer, a carrier transport layer and a carrier blocking layer in addition to the light-emitting layer, on both sides thereof.

One of the known techniques of forming the organic layer of organic EL elements is an ink-jet (IJ) method. With the IJ method, a red light-emitting segment, a green light-emitting segment and a blue light-emitting segment of a light-emitting layer which constitutes a pixel of the organic EL elements can be form as fine patterns without requiring the so-called patterning. The ink used for the IJ method generally contains, as solute, an organic EL material which is relatively easily dissolve to an organic solvent.

However, the solute dissolved in such ink precipitates with time by external factors such as light, air and temperature, which may likely cause problems including clogging of ink in the ink-jet head.

DETAILED DESCRIPTION

According to one embodiment, an ink for organic EL comprises an organic EL contributing material and an organic solvent. A relative energy difference RED based on Hansen solubility parameters which attribute to the organic EL contributing material and the organic solvent, respectively, is less than 0.5.

The organic EL contributing material is an organic material contributing to organic EL, and contains an organic EL material (a light-emitting material of R, G or B), a carrier transport material (an electron transport material or a hole transport material), carrier injection material (an electron injection material or a hole injection material) and a carrier blocking material (an electron blocking material or a hole blocking material).

The Hansen solubility parameters (HSP) include three parameters of energy ($\delta D$) by London dispersion force, energy ($\delta P$) by dipole interaction and energy ($\delta H$) by hydrogen bonding. The HSP is a vector quantity represented as ($\delta D$, $\delta P$, $\delta H$) and is expressed by plotting on a three-dimensional space (Hansen space) defined by coordinate axes of the three parameters. The unit of each parameter is $(J/cm^3)^{1/2}$. As to the HSP, for example, the HSP is disclosed in Hansen Solubility Parameters: A User's Handbook, Second Edition on Charles M. Hansen, pages 1 to 26.

The HSP of the generally available substances are compiled in a database. Therefore, by referring to the database, the HSP of a desired substance can be obtained. The HSP of a substance not registered in the database can be calculated from the chemical structure of the substance, for example, by using a computer software such as Hansen Solubility Parameters in Practice (HSPiP).

The HSP of a mixture containing two or more substances is computed as a vectorial sum of the values obtained by multiplying the HSP of each substance by the volume ratio of the respective substance to the entire mixture.

The relative energy difference (RED) is represented by Formula (1) below:

$$RED = R_a/R_O \quad (1)$$

where $R_a$ is the distance between the HSP attributed to the solute and the HSP attributed to the solvent, that is, the HSP distance, and $R_O$ is the interaction radius of the solute.

$R_a$ (HSP distance) is represented by Formula (2) below:

$$R_a = \{4(\delta D_S - \delta D_L)^2 + (\delta P_S - \delta P_L)^2 + (\delta H_S - \delta H_L)^2\}^{0.5} \quad (2)$$

where $\delta D_S$ is the energy by the London dispersion force of the solute, $\delta P_S$ is the energy by the dipole interaction of the solute, $\delta H_S$ is the energy by the hydrogen bonding of the solute, $\delta D_L$ is the energy by the London dispersion force of the solvent, $\delta P_L$ is the energy by the dipole interaction of the solvent and $\delta H_L$ is the energy by the hydrogen bonding of the solvent.

$R_O$ (the interaction radius of the solute) is determined, for example, by the following method. First, a solute for which $R_O$ is sought and several kinds of solvents whose HSP are already known are prepared. Then, a solubility test of the solute for each solvent is carried out. In the solubility test, the HSP attributed to the solvent exhibiting a solubility and the HSP attributed to the solvent not exhibiting the solubility are each plotted on the Hansen space. Then, based on the plotted HSP attributed to each solvent, a virtual sphere (Hansen sphere) including the HSP attributed to the solvent exhibiting the solubility and not including the HSP attributed to the solvent not exhibiting the solubility is formed on the Hansen space. The radius of the Hansen sphere is $R_O$.

Note that $R_O$ is dependent on the concentration of the solution. For example, when the solute is added to a solvent to prepare a high concentration solution and a low concentration solution, respectively, $R_O$ of the solute contained in the high concentration solution is relatively small as compared to $R_O$ of the solute contained in the low concentration solution.

In the ink for organic EL according to the embodiment, the RED based on the HSP attributed to the organic EL contribution material and the HSP attributed to the organic solvent is less than 0.5. In an organic ink having a RED of less than 0.5, for example the organic EL contributing material exhibits the solubility to the organic solvent. In other words, such ink exhibits a solution stability. Where, the solution stability means that a precipitation does not occur even if 30 days pass after the organic EL contribution material is dissolved into the organic solvent. The organic EL ink according to the embodiment exhibits still higher solution stability as the RED approaches zero.

Incidentally, when producing inks for organic EL, the concept of the HSP which exhibit the solubility of the solute and the solvent is used as the general tool. A solvent selected using the concept of the HSP should desirably be that included in the Hansen sphere of the solute. That is, RED should be less than 1. However, even in the case of inks for organic EL whose RED less than 1 and the solute is dissolved in the solvent, precipitation of the solute may occur with time by external factors such as light, air and temperature. Therefore, conventionally, it was generally considered that, in order to prepare the solution excellent in solution stability, a solute and a solvent which have a RED of less than 1, and also a skeleton or a functional group which cannot be easily influenced by the external factors need to be selected. However, it has been found the ink for organic EL according to the embodiment exhibits solution stability by setting RED to less than 0.5 even without selecting a skeleton or a functional group which cannot be easily influenced by the external factors.

The organic EL contribution material according to the embodiment may contain an organic compound having a molecular weight of exceeding 1,000, or 1,000 or less.

In one embodiment, the organic EL contributing material is an organic compound having a molecular weight of 1,000 or less. The organic EL contributing material having a molecular weight of 1,000 or less is disclosed as a low molecular organic EL contributing material, in, for example, WO 2012/132863, paragraph 0042, NHK Science and Technology Research Laboratories, R&D, No. 145, 2014.5, page 19, a report printed issued by the Takeda Foundation, Sep. 9, 1930 on Junji Kido (Yamagata University), page 9, Recent Progress in Fabrication of Organic Thin Film and Device Applications, Chapter 3.1, page 234.

In another embodiment, the organic EL contributing material is an organic compound having a molecular weight of exceeding 1,000. The organic EL contributing materials having a molecular weight of exceeding 1,000 are disclosed as high molecular organic EL contributing materials in the above-listed literature.

High molecular organic EL contributing materials are relatively easily dissolvable to an organic solvent as compared with the low molecular organic EL contributing material, and therefore they are applied to the ink for organic EL as solutes. In the ink for organic EL containing the high molecular organic EL contributing material and the organic solvent, the high-molecular organic EL contributing material can be well dissolved to an organic solvent by setting RED to less than 0.5, exhibiting excellent solution stability.

On the other hand, there is a tendency that the low molecular organic EL contributing material has a low solubility to an organic solvent as compared with the high molecular organic EL contributing material. However, in the ink for organic EL containing the low molecular organic EL contributing material and the organic solvent, the low molecular organic EL contributing material can be dissolved to an organic solvent by setting RED to less than 0.5. Such ink for organic EL exhibits excellent solution stability, by which precipitation does not occur if 30 days pass after the organic EL contributing material was dissolved into the organic solvent.

Examples of the light-emitting material include such fluorescent materials as F8-co-F6 (copolymer of F8 (polydioctylfluorene) and F6 (polydihexylfluorene)), an oxinoid compound, a perylene compound, a coumarin compound, an azacoumarin compound, an oxazole compound, an oxadiazole compound, a perinone compound, a pyrrolopyrrole compound, a naphthalene compound, an anthracene compound, a fluorene compound, a fluoranthene compound, a tetracene compound, a pyrene compound, a coronene compound, a quinolone compound, an azaquinolone compound, a pyrazoline derivative, a pyrazolone derivative, a rhodamine compound, a chrysene compound, a phenanthrene compound, a cyclopentadiene compound, a stilbene compound, a diphenylquinone compound, a styryl compound, a butadiene compound, a dicyanomethylenepyran compound, a dicyanomethylenethiopyran compound, a fluorescein compound, a pyrylium compound, a thiapyrylium compound, a selenapyrylium compound, a telluropyrylium compound, an aromatic aldadiene compound, an oligophenylene compound, a thioxanthene compound, an anthracene compound, a cyanine compound, an acridine compound, a metal complex of 8-hydroxyquinoline compound, a metal complex of 2-bipyridine compound, a complex of a Schiff base and a group III metal, an oxine metal complex and a rare earth complex. These compounds and complexes may be used solely or in any combination thereof.

Examples of the hole transport material include a triazole derivative, an oxadiazole derivative, an imidazole derivative, a polyarylalkane derivative, a pyrazoline derivative, a pyrazolone derivative, a phenylenediamine derivative, an arylamine derivative, an amino-substituted chalcone derivative, an oxazole derivative, a styrylanthracene derivative, a fluorenone derivative, a hydrazone derivative, a stilbene derivative, a porphyrin compound, an aromatic tertiary amine compound, a styrylamine compound, a butadiene compound, a polystyrene derivative, a triphenylmethane derivative and a tetraphenylbenzine derivative. These compounds and complexes may be used solely or in any combination thereof. Further, the hole transport material may be used as an electron blocking material.

Examples of the electron transport material include a phenanthroline derivative, a pyridine derivative, a tetrazine derivative, a compound containing a heterocycle such as an oxadiazole derivative and a metal complex such as a tris (8-hydroxyquinolinato) aluminium complex ($Alq_3$). The electron transport material may be used as a hole blocking material.

Examples of the hole injection material include metal oxides such as MoOx (molybdenum oxide), WOx (tungsten oxide) and MoxWyOz (molybdenum-tungsten oxide) (where x, y and z are positive numbers), a metal nitride and a metal oxynitride.

Examples of the electron injection material include alkali metals such as lithium and sodium, alkaline earth metals such as calcium and magnesium, inorganic compounds of alkali metals or alkaline earth metals, such as lithium fluoride and lithium oxide, an organometallic complex containing an alkali metal or an alkaline earth metal as a central metal and such as 8-hydroxyquinolinolate lithium.

Examples of the organic solvent according to the embodiment include an ester-based organic solvent, an ether-based organic solvent, a ketone-based organic solvent, a naphthalene-based organic solvent, an alcohol-based organic solvent and a hydrocarbon-based organic solvent. These organic solvents may be used solely or in any combination thereof, although not limited even to these.

Examples of the ester-based organic solvent include methyl benzoate, ethyl benzoate, propyl benzoate, butyl benzoate, amyl benzoate, hexyl benzoate, isobutyl benzoate, isopropyl benzoate, isopentyl benzoate, benzyl benzoate, benzyl acetate, methylbenzyl acetate, methylphenyl acetate, ethylphenyl acetate, o-tolyl acetate, m-tolyl acetate, 2-phenoxyethanol acetate, phenethyl acetate, tetrahydrofurfuryl acetate, ethylcyclohexyl acetate, 3-phenylpropyl acetate, benzyl butyrate, benzyl isobutyrate, styralyl butyrate, cyclohexyl butyrate, methyl 4-phenylbutyrate phenylethyl isobutyrate, 2-phenylpropyl isobutyrate, benzyl formate, phenylethyl formate, 3-phenylpropyl formate, cyclohexyl formate, benzyl hexanoate, phenylethyl hexanoate, 3-phenylpropyl hexanoate, cyclohexyl hexanoate, crotonolactone, γ-butyrolactone, β-butyrolactone, ε-caprolactone, γ-valerolactone, γ-undecalactone, δ-decanolactone, γ-nonalactone, a dimethyl phthalate, diethyl phthalate, benzyl propionate, styrallyl propionate, 2-phenylethyl propionate, p-cresyl propionate, 3-phenylpropyl propionate, cyclohexyl propionate, tetrahydrofurfuryl propionate, ethyl cyclohexane propionate, benzyl valerate, 2-phenethyl valerate, benzyl isovalerate, phenylpropyl valerate, phenethyl isovalerate, 3-phenylpropyl isovalerate, cyclohexyl isovalerate, 4-ethyl-1,3-dioxolan-2-one, ethyl 3-phenylpropionate, cyclohexyl acetate, methyl cyclohexanecarboxylate and ethyl 3-phenylacrylate.

Examples of the ether-based organic solvent include anisole, methylanisole, dimethylanisole, ethylanisole, ethoxyanisole, benzaldehyde dimethyl acetal, p-anisic aldehyde dimethyl acetal, phenylacetaldehyde dimethyl acetal, dimethoxybenzene, diethoxybenzene, dimethoxytoluene, 1-methoxy-4-propoxybenzene, 2,3-benzofuran, 2-methylbenzofuran, 2,3-dimethylbenzofuran, 2-butylbenzofuran, 2-pentylbenzofuran, 2-heptylbenzofuran, 2-octylbenzofuran, dibenzyl ether, ethyl phenyl ether, benzyl methyl ether, benzyl ethyl ether, phenyl propyl ether, phenyl isopropyl ether, butyl phenyl ether, butyl benzyl ether, pentyl phenyl ether, phenethyl butyl ether and anethole.

Examples of the ketone-based organic solvent include benzylacetone, benzoylacetone, benzaldehyde, m-anisaldehyde, o-tolualdehyde, p-tolualdehyde, 4-ethylbenzaldehyde, (p-methylphenoxy) acetaldehyde, p-isopropylbenzaldehyde, 3-phenylpropionaldehyde, trans-cinnamaldehyde, cyclohexanone, 2-methylcyclohexanone, 4-methylcyclohexanone, 2-cyclohexylcyclohexanone, cycloheptanone, acetophenone, o-methylacetophenone, m-methylacetophenone, propiophenone, p-isopropylacetophenone, valerophenone, p-ethylacetophenone, benzyl methyl ketone, isophorone, cyclopentanone, pulegone and 2-cyclopenten-1-one.

Examples of the naphthalene-based organic solvent include 1-methylnaphthalene, 1-ethylnaphthalene, 1-propylnaphthalene, 2-isopropylnaphthalene, 1-butylnaphthalene, 1-pentylnaphthalene, 1-dihydronaphthalene, 1-methoxynaphthalene, 1-ethoxynaphthalene, tetrahydronaphthalene, 2-methyl-1,2,3,4-tetrahydronaphthalene, 1-ethyl-1,2,3,4-tetrahydronaphthalene, 1,2,3,4-tetrahydro-6-methylnaphthalene, 1,2,3,4-tetrahydro-1,4-dimethylnaphtalene, trans-decahydronaphthalene, cis-decahydronaphthalene, 2-methyl-trans-decahydronaphthalene and 4A-methyl-cis-decahydronaphthalene.

Examples of the alcohol-based organic solvent include nonylphenol, benzyl alcohol, 3-butylphenol, 3-sec-butylphenol, 3-propylphenol, cyclohexylpropanol and 2-isobutylphenol.

Examples of the hydrocarbon-based organic solvent include toluene, o-xylene, m-xylene, p-xylene, ethylbenzene, 3-methylbiphenyl, cyclohexylbenzene, 1,2,3,4-tetramethylbenzene, p-cymene, indene, 1,1-diphenylethylene, mesitylene, 1,1-diethylbenzene, m-ethyltoluene, 3-ethyl-o-xylene, propylbenzene, n-butylbenzene, m-diethylbenzene, pentylbenzene and hexylbenzene.

Examples of the other organic solvent include dimethyl salicylate, p-anisyl isobutyrate, guaiacylacetic acid, ethyl o-anisate, N,N-diethylaniline, 1-methyl-2-pyrrolidone, 2-methylpyrazine and 4-chloroanisole.

EXAMPLES

The ink for organic EL according to the embodiment will now be described by way of examples.

Seven organic solvents, N-methyl-2-pyrrolidone, isophorone, 2-methylcyclohexanone, ethyl cinnamate, methyl benzoate, dimethyl salicylate and 2-cyclopenten-1-one, and an organic EL material (solute), which is a fluorene-based copolymer having a molecular weight of 1,000 or less were prepared.

The HSP attributed to the organic EL material were (18.5, 9.1, 5.7) and the interaction radius $R_O$ was 3.6.

The HSP attributed to the organic solvents are as listed in Table 1 below. Each RED was calculated using the HSP attributed to the solute and the interaction radius (see Table 1).

For each example, 5.0 ml of the organic solvent and 0.1 g of the fluorene-based copolymer were agitated in a shaker at rotation of 100 rpm for 24 hours under the atmospheric air at a temperature of 60° C., dissolving the solute, and thus inks for organic EL of Examples 1 to 7 were prepared.

These inks were stored in a yellow room from immediately after preparation under nitrogen atmosphere at room temperature, and for each example, the time until precipitation of the solute started occur was measured by visual inspection. The visual inspection was carried out in the atmosphere by taking out from the yellow room. The results are shown in Table 1 below.

TABLE 1

| Ex. | Organic solvents | δD | δP | δH | RED | Time to precipitation (days) |
|---|---|---|---|---|---|---|
| 1 | N-methyl-2-pyrrolidone | 18.0 | 12.3 | 7.2 | 1.00 | 0.5 |
| 2 | Isophorone | 17.0 | 8.0 | 5.0 | 0.91 | 0.5 |
| 3 | 2-methylcyclohexanone | 17.6 | 7.8 | 4.7 | 0.68 | 9.0 |
| 4 | Ethyl cinnamate | 18.4 | 8.2 | 4.1 | 0.53 | 12.0 |
| 5 | Methyl benzoate | 18.9 | 8.2 | 4.7 | 0.41 | 30.0 |
| 6 | Dimethyl salicylate | 18.4 | 8.3 | 5.3 | 0.25 | 44.0 |
| 7 | 2-cyclopenten-1-one | 18.4 | 9.2 | 6.2 | 0.16 | 50.0 |

As is clear from Table 1 above, it can be understood that the inks for organic EL using Examples 5 to 7, in which the RED value with respect to the solute is less than 0.5, namely, methyl benzoate, dimethyl salicylate and 2-cyclopenten-1-one, respectively, take significantly longer time until the precipitation of the solute as compared to those of Examples 1 to 4 in which RED is 0.5 or more. In other words, it is found that the inks for organic EL of Examples 5 to 7, in which RED are less than 0.5, exhibit remarkably improved solution stability. Further, the solution stability improves further as the RED approaches zero.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An ink for organic EL, comprising:
   an organic EL contributing material; and
   an organic solvent,
   wherein a relative energy difference (RED) based on Hansen solubility parameters which attribute to the organic EL contributing material and the organic solvent, respectively, is less than 0.5, and precipitation does not occur within 30 days after the organic EL contributing material is dissolved into the organic solvent.

2. The ink for organic EL, of claim 1, wherein the organic EL contributing material contains an organic compound having a molecular weight of 1,000 or less.

3. The ink for organic EL of claim 2, wherein the organic EL contributing material is one of a light-emitting material, a carrier transport material, a carrier injection material and a carrier blocking material.

4. The ink for organic EL, of claim 1, wherein the organic EL contributing material contains an organic compound of a molecular weight of exceeding 1,000.

5. The ink for organic EL of claim 4, wherein the organic EL contributing material is one of a light-emitting material, a carrier transport material, a carrier injection material and a carrier blocking material.

6. The ink for organic EL of claim 1, wherein the organic EL contributing material is one of a light-emitting material, a carrier transport material, a carrier injection material and a carrier blocking material.

7. The ink of organic EL of claim 1, wherein the organic EL contributing material comprises a fluorene-based copolymer having a molecular weight of 1,000 or less; and
the organic solvent is methyl benzoate, dimethyl salicylate, or 2-cyclopenten-1-one.

* * * * *